United States Patent [19]
Li et al.

[11] Patent Number: 6,162,368
[45] Date of Patent: Dec. 19, 2000

[54] TECHNIQUE FOR CHEMICAL MECHANICAL POLISHING SILICON

[75] Inventors: Shijian Li, San Jose; Thomas H. Osterheld, Mountain View; Fred C. Redeker, Fremont, all of Calif.

[73] Assignee: Applied Materials, Inc., Santa Clara, Calif.

[21] Appl. No.: 09/097,004

[22] Filed: Jun. 13, 1998

[51] Int. Cl.⁷ .............................. B44C 1/22; H01L 21/00
[52] U.S. Cl. .............................. 216/89; 216/38; 216/88; 438/692; 438/693
[58] Field of Search .................... 216/38, 88, 89, 216/99; 438/692, 693, 749

[56] References Cited

U.S. PATENT DOCUMENTS

| | | | |
|---|---|---|---|
| 4,671,851 | 6/1987 | Beyer et al. | 156/645 |
| 5,702,977 | 12/1997 | Jang et al. | 437/67 |
| 5,726,099 | 3/1998 | Jaso | 438/693 |
| 5,804,507 | 9/1998 | Perlov et al. | 438/692 |
| 5,934,980 | 8/1999 | Koss et al. | 451/41 |
| 5,942,449 | 8/1999 | Meikle | 438/747 |

FOREIGN PATENT DOCUMENTS

| | | |
|---|---|---|
| 0 684 634 A2 | 11/1995 | European Pat. Off. . |
| 0 757 378 A1 | 2/1997 | European Pat. Off. . |

*Primary Examiner*—Randy Gulakowski
*Assistant Examiner*—Shamim Ahmed
*Attorney, Agent, or Firm*—Fish & Richardson

[57] ABSTRACT

Chemical mechanical polishing of a silicon layer, such as a polycrystalline silicon, is improved by initially chemical mechanically polishing the silicon layer with an oxide-polishing slurry. Then the silicon layer is chemical mechanically polished with a silicon-polishing slurry until the substrate is planarized.

33 Claims, 4 Drawing Sheets

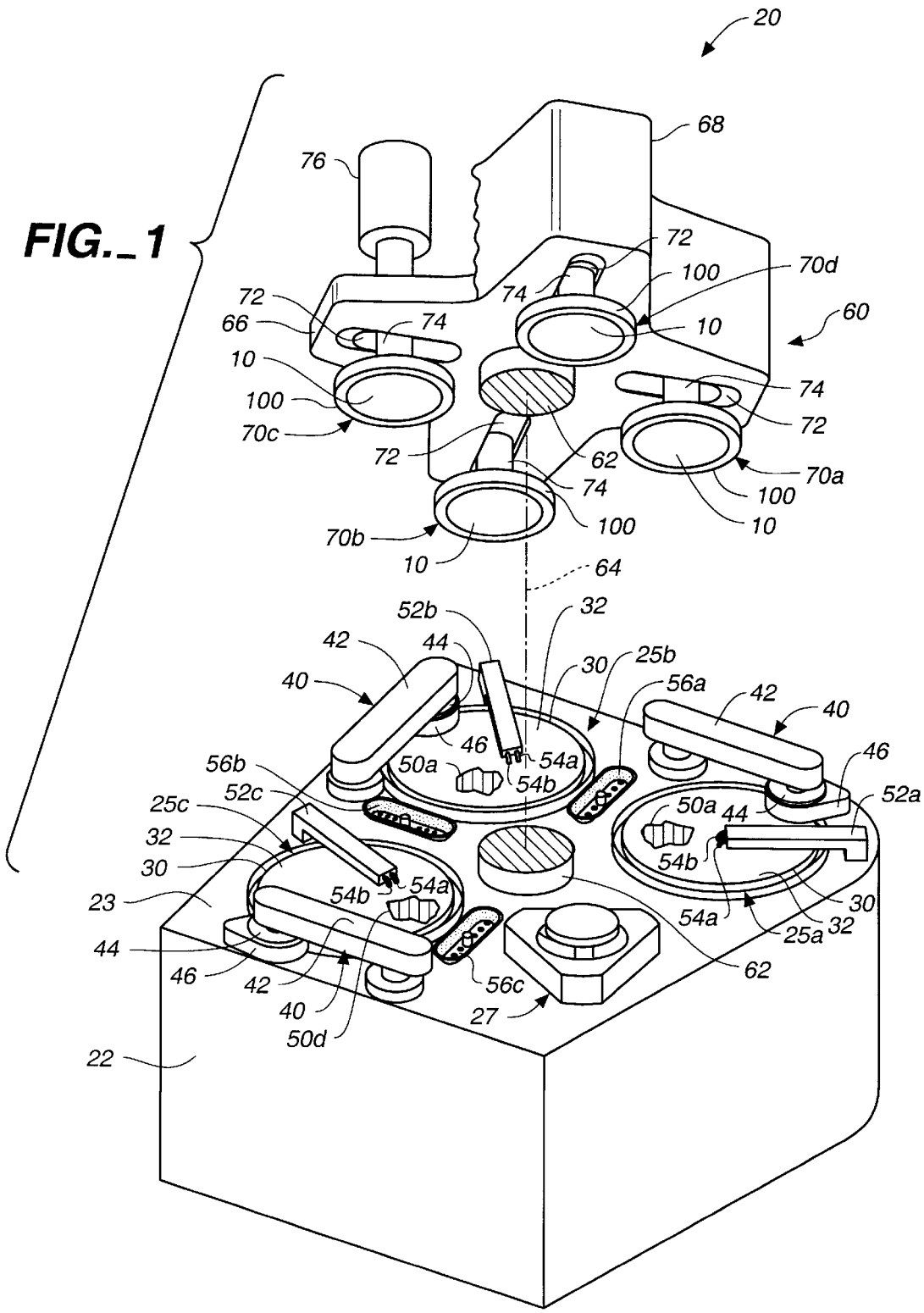
FIG._1

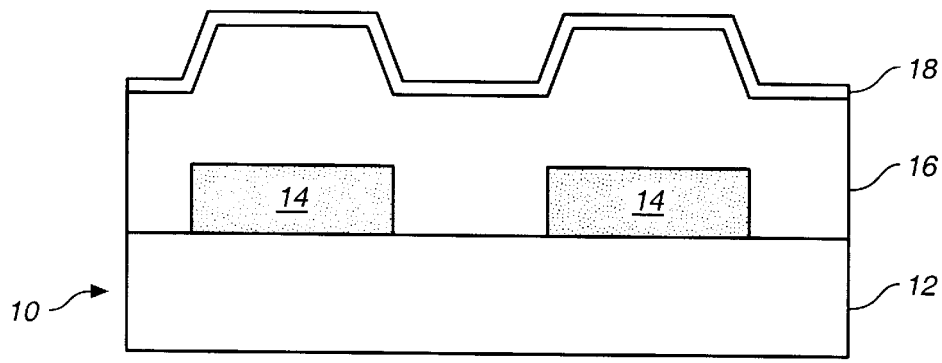
FIG._2A
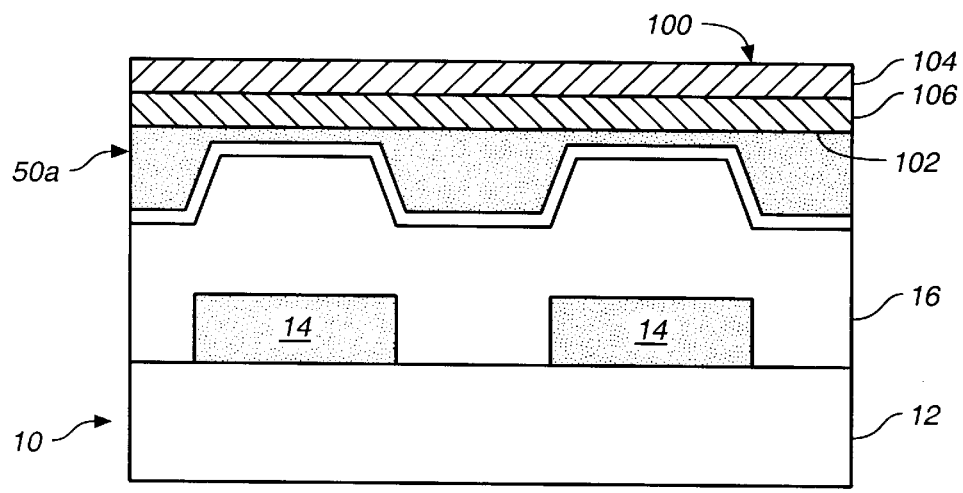
FIG._2B
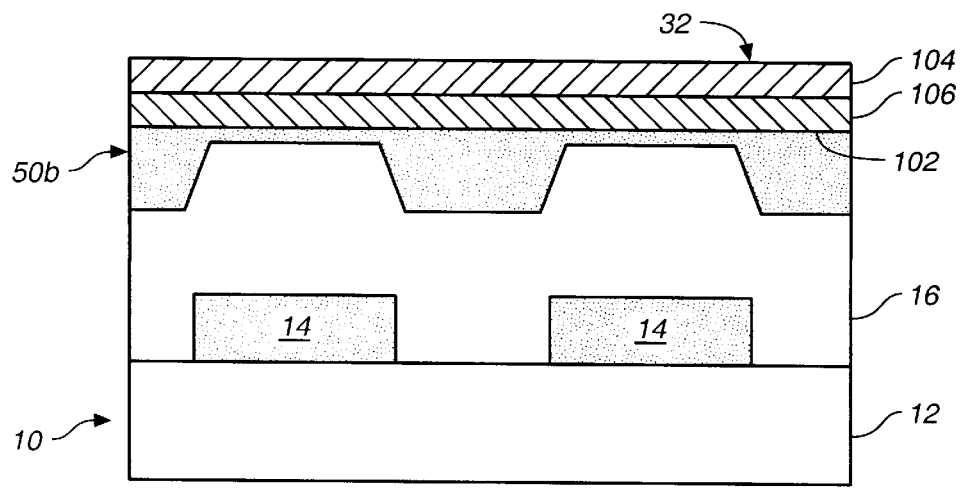
FIG._2C

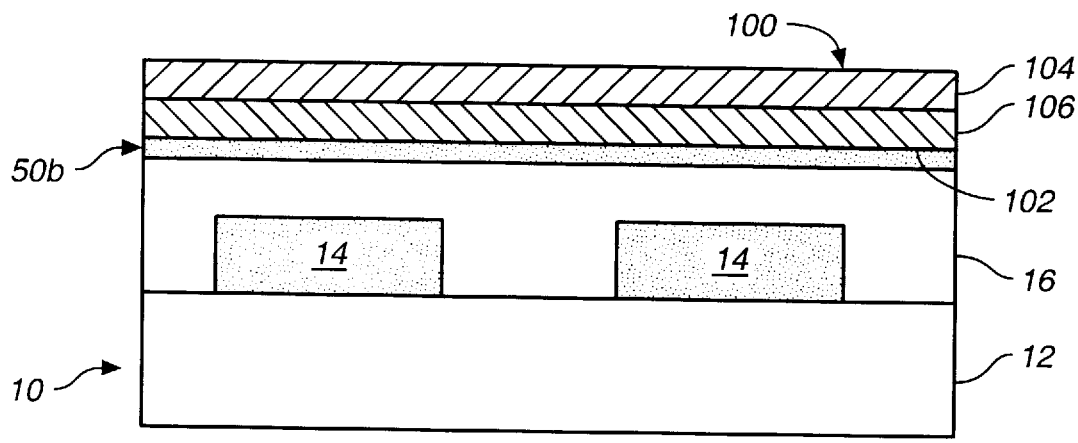
FIG._2D
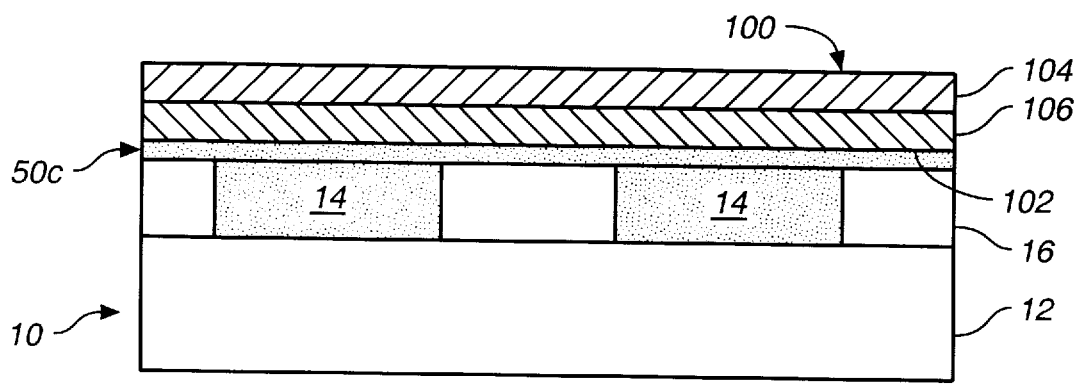
FIG._2E
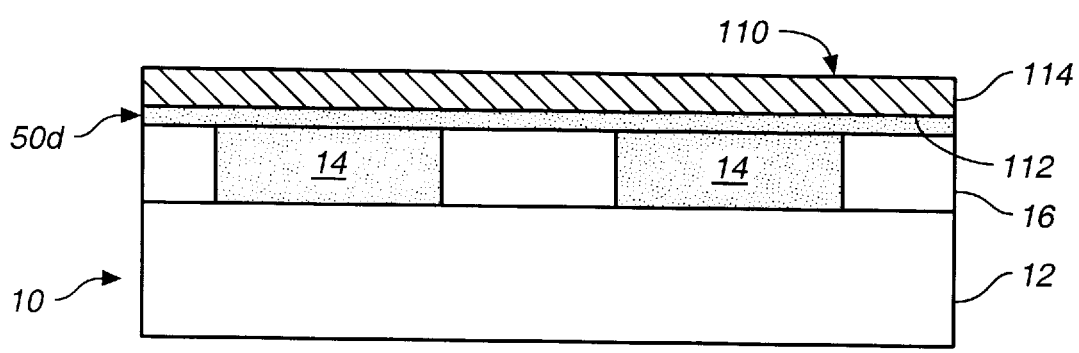
FIG._2F

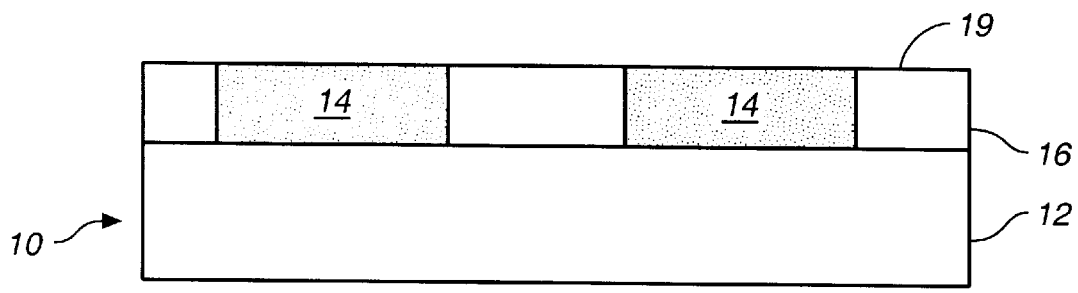
FIG._2G
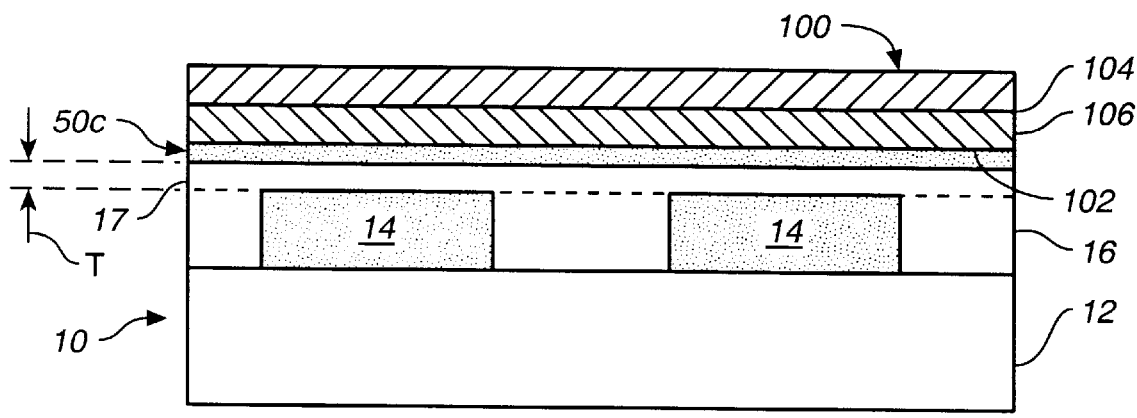
FIG._2H
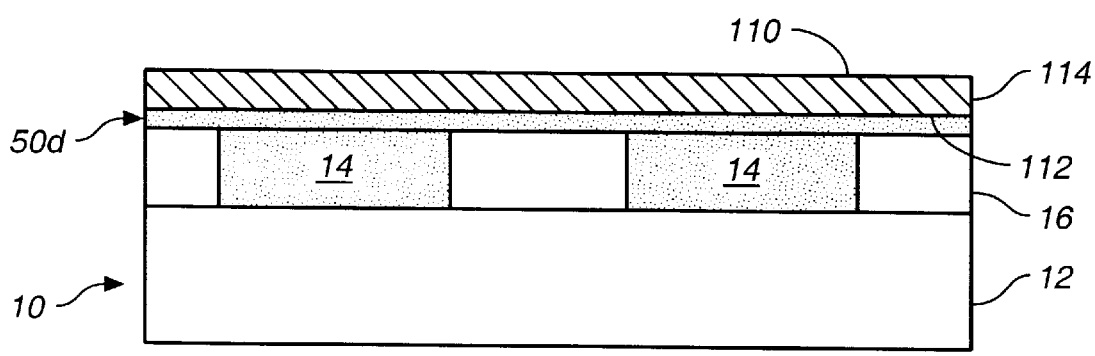
FIG._2I

TECHNIQUE FOR CHEMICAL MECHANICAL POLISHING SILICON

BACKGROUND

The present invention relates generally to chemical mechanical polishing of substrates, and more particularly to a technique for chemical mechanical polishing silicon.

An integrated circuit is typically formed on a substrate by the sequential deposition of conductive, semiconductive or insulative layers on a silicon wafer. After each layer is deposited, it may be etched to create circuitry features. One fabrication step involves the formation of vias, plugs and lines to provide conductive paths between thin film circuits. Vias can be created by depositing a conductive layer, such as polycrystalline silicon (polysilicon or p-Si), over a patterned insulative layer, and then planarizing the polysilicon layer by polishing or etching until the insulative layer is exposed. The portions of the polysilicon layer remaining between the raised pattern of the insulative layer form the vias, plugs and lines.

Chemical mechanical polishing (CMP) is one accepted method of planarizing and exposing the insulative layer. This method typically requires that the substrate be mounted on a carrier or polishing head. The exposed surface of the substrate is placed against a moving, e.g., rotating, polishing pad. The polishing pad may be either a "standard" pad or a fixed-abrasive pad. A standard pad has a durable roughened surface, whereas a fixed-abrasive pad has abrasive particles held in a containment media. The carrier head provides a controllable load, i.e., pressure, on the substrate to push it against the polishing pad. A polishing slurry, including at least one chemically-reactive agent, and abrasive particles if a standard pad is used, or a chemical solution without abrasive particles if a fixed abrasive pad is used, is supplied to the surface of the polishing pad. An effective CMP process not only provides a high polishing rate, but also provides a substrate surface which is finished (lacks small-scale roughness) and flat (lacks large-scale topography). In addition, an effective CMP process produces minimal dishing (over-polishing of the polysilicon layer so that it is lower than the insulative layer) and erosion (removal of the insulative layer).

One problem that has been encountered in CMP, particularly in the polishing of polysilicon layers, is non-uniform polishing, such as the so-called "center slow effect", which is the tendency for the substrate center to be polished more slowly than the substrate edge. The center slow effect typically results in underpolishing (the removal of too little material) at the central portion of the substrate. Equivalently, if the polishing parameters are changed to increase the amount of material removed from the substrate central portion, then the outer portion of the substrate will be overpolished, resulting in dishing and erosion. The underpolishing of the substrate center or the overpolishing of the substrate edge reduces the overall flatness of the substrate, making either the center or the edge of the substrate unsuitable for integrated circuit fabrication and reducing process yield.

SUMMARY

In one aspect, the invention is directed to a method of polishing a silicon layer on a substrate. In the method, the silicon layer is chemical mechanically polished with an oxide-polishing slurry to remove any native oxides, and chemical mechanically polished with a silicon-polishing slurry.

Implementations of the invention may include the following. The silicon layer may be polished until it is planarized or until an underlying layer is exposed. The first CMP step stops before the silicon layer is substantially planarized or the underlying layer is exposed. The first CMP step and a portion of the second CMP step may be performed at the same polishing station. The second CMP step may be performed at a plurality of polishing stations. The oxide-polishing slurry may be distributed onto a polishing pad at the polishing station before, as, or after the substrate is brought into contact with the polishing pad. In addition, distribution of the oxide-polishing slurry may stop before, as, or after distribution of the silicon-polishing slurry starts. The substrate may be buffed with a buffing solution after the second CMP step. The silicon layer may be polycrystalline silicon, amorphous silicon, or single crystalline silicon. The polishing slurry may be a polycrystalline silicon-polishing slurry, an amorphous silicon-polishing slurry, or a single crystalline silicon-polishing slurry. The silicon-polishing slurry may have a selectivity of at least 1:50. The first CMP step may last less than about ten seconds, e.g., about three to five seconds.

In another aspect, the invention is directed to a method of planarizing a substrate. In the method, a silicon layer is formed on a non-planar surface of the substrate, an oxide-polishing slurry is supplied to a surface of a polishing pad, and the substrate is brought into contact with the polishing pad. The substrate is briefly chemical mechanically polished with the oxide-polishing slurry to remove a native oxide layer from a surface of the silicon layer. After the substrate contacts the polishing pad, a silicon-polishing slurry is supplied to the polishing pad, and the substrate is chemical mechanically polished with the silicon-polishing slurry until the silicon layer is substantially planarized.

Advantages of the invention may include the following. The center slow effect is reduced, improving the flatness and finish of the substrate, reducing dishing and erosion, and increasing the process yield.

Other features and advantages will be apparent from the following description, including the drawings and claims.

BRIEF DESCRIPTION OF THE DRAWINGS

FIG. 1 is a schematic exploded perspective view of a chemical mechanical polishing apparat FIGS. 2A–2I are schematic cross-sectional views of a substrate illustrating techniques of the present invention.

DETAILED DESCRIPTION

Referring to FIG. 1, one or more substrates 10 will be polished by a chemical mechanical polishing (CMP) apparatus 20. A description of a similar polishing apparatus may be found in U.S. Pat. No. 5,738,574, the entire disclosure of which is incorporated herein by reference. Polishing apparatus 20 includes a lower machine base 22 with a table top 23 mounted thereon and a removable outer cover (not shown). Table top 23 supports a series of polishing stations, including a first polishing station 25a, a second polishing station 25b, a final polishing station 25c, and a transfer station 27. Transfer station 27 forms a generally square arrangement with polishing stations 25a, 25b and 25c. Transfer station 27 serves multiple functions, including receiving individual substrates 10 from a loading apparatus (not shown), washing the substrates, loading the substrates into the carrier heads, receiving the substrates from the carrier heads, washing the substrates again, and finally, transferring the substrates back to the loading apparatus.

Each polishing station includes a rotatable platen 30 on which is placed a polishing pad. If substrate 10 is an "eight-inch" (200 millimeter) or "twelve-inch" (300 millimeter) diameter disk, then the platen and polishing pad will be about twenty inches or thirty inches in diameter, respectively. Each platen 30 may be a rotatable aluminum or stainless steel plate connected to a platen drive motor (not shown). For most polishing processes, the platen drive motor rotates platen 30 at thirty to two hundred revolutions per minute, although lower or higher rotational speeds may be used.

At first and second polishing stations 25a and 25b, platen 30 may support a two-layer polishing pad 100 having an inner layer 104 and an outer layer 106 with a rough surface 102 (see FIG. 2B). The inner layer of the pad may be attached to platen 30 by a pressure-sensitive adhesive layer. The outer layer may be harder than the inner layer. For example, the outer layer may be composed of microporous polyurethane or polyurethane mixed with a filler, whereas the inner layer may be composed of compressed felt fibers leached with urethane. A two-layer polishing pad, with the outer layer composed of IC-1000 or IC-1400 and the inner layer composed of SUBA-4, is available from Rodel, Inc. of Newark, Del. (IC-1000, IC-1400 and SUBA-4 are product names of Rodel, Inc.).

At final polishing station 25c, platen 30 may support a polishing pad 110 having a generally smooth surface 112 and a single soft layer 114 (see FIG. 2F). This single layer pad may be attached to platen 30 by a pressure-sensitive adhesive layer. The soft pad may be composed of a napped poromeric synthetic material. A suitable soft polishing pad is available from Rodel, Inc., under the trade name Politex. The polishing pads may be embossed or stamped with a pattern to improve distribution of slurry across the face of the substrate.

Each polishing station 25a, 25b and 25c also includes a combined slurry/rinse arm 52a, 52b and 52c, respectively, that projects over the associated polishing pad surface. Each slurry/rinse arm 52a–52c may include two or more slurry supply tubes 54a and 54b connected to a slurry delivery system to provide two or more slurries to the surface of the polishing pad. Typically, sufficient slurry is provided to cover and wet the entire polishing pad. Each slurry/rinse arm 52a–52c also includes several spray nozzles (not shown) which provide a high-pressure rinse of the polishing pad at the end of each polishing and conditioning cycle.

Two or more intermediate washing stations 56a and 56b may be positioned between neighboring polishing stations 25a, 25b and 25c. The washing stations rinse the substrates as they pass from one polishing station to another.

Each polishing station 25a–25c may further include an associated pad conditioner apparatus 40. Each pad conditioner apparatus 40 has a rotatable arm 42 holding an independently-rotating conditioner head 44 and an associated washing basin 46. The pad conditioner apparatus maintains the condition of the polishing pad so that it will effectively polish substrates.

A rotatable multi-head carousel 60 is positioned above lower machine base 22. Carousel 60 is supported by a center post 62 and is rotated thereon about a carousel axis 64 by a carousel motor assembly located within machine base 22. Center post 62 supports a carousel support plate 66 and a cover 68. Carousel 60 includes four carrier head systems 70a, 70b, 70c, and 70d. Three of the carrier head systems receive and hold substrates, and polish them by pressing them against the polishing pads on the platens of polishing stations 25a–25c. One of the carrier head systems receives a substrate from and delivers a substrate to transfer station 27.

The four carrier head systems 70a–70d are mounted on carousel support plate 66 at equal angular intervals about carousel axis 64. Center post 62 allows the carousel motor to rotate carousel support plate 66 and to orbit carrier head systems 70a–70d and the substrates attached thereto about carousel axis 64.

Each carrier head system 70a–70d includes a carrier or carrier head 80. A carrier drive shaft 74 connects a carrier head rotation motor 76 (shown by the removal of one quarter of cover 68) to carrier head 80 so that each carrier head 80 can independently rotate about its own axis. There is one carrier drive shaft and motor for each head. In addition, each carrier head 80 independently laterally oscillates in a radial slot 72 formed in carousel support plate 66. A slider (not shown) supports each drive shaft in its associated radial slot. A radial drive motor (not shown) may move the slider to laterally oscillate the carrier head.

The carrier head 80 performs several mechanical functions. Generally, the carrier head holds the substrate against the polishing pad, evenly distributes a downward pressure across the back surface of the substrate, transfers torque from the drive shaft to the substrate, and ensures that the substrate does not slip out from beneath the carrier head during polishing operations.

The carrier head 80 may include a flexible membrane (not shown) which provides a substrate receiving surface. A description of a suitable carrier head 80 may be found in U.S. Patent Application Ser. No. 08/745,679, entitled a CARRIER HEAD WITH a FLEXIBLE MEMBRANE FOR a CHEMICAL MECHANICAL POLISHING SYSTEM, filed Nov. 8, 1996, by Steven M. Zuniga et al., assigned to the assignee of the present invention, the entire disclosure of which is incorporated herein by reference.

FIGS. 2A–2G illustrate a process of chemical-mechanically polishing a silicon layer. As shown in FIG. 2A, substrate 10 includes an insulative layer 14, such as silicon dioxide, disposed on a semiconductive layer, such as a silicon wafer 12. The insulative layer 14 is either patterned or disposed on a patterned underlying layer so that it provides a non-planar outer surface. A polysilicon layer 16 is disposed over insulative layer 14. As shown, the outer surface of polysilicon layer 16 almost exactly replicates the underlying structures of layer 14, creating a series of peaks and valleys so that the exposed surface of the substrate is non-planar. In other embodiments, other sorts of silicon layers, such as amorphous silicon (a-Si) and single crystal silicon, may be used instead of a polysilicon layer.

As discussed above, one purpose of planarization is to polish polysilicon layer 16 until the top surface of insulative layer 14 is exposed, thus leaving polysilicon vias between the insulative islands, and polysilicon plugs in any holes in the insulative layer (see FIG. 2G). Unfortunately, as previously noted, one problem with polishing polysilicon is the center slow effect. Without being limited to any particular theory, one possible cause of the center slow effect is the formation of a layer of native oxide 18 on the outer surface of polysilicon layer 16 when the substrate is exposed to the atmosphere. Although this native oxide layer may be extremely thin, e.g., on the order of a few atomic layers, polysilicon-polishing slurries are highly selective (i.e., the polishing rate depends strongly on the composition of the surface being polished) to avoid polishing of underlying insulative layer 14. Consequently, native oxide layer 18 interferes with the polishing of the polysilicon layer 16.

Referring to FIG. 2B, substrate 10 is polished at polishing station 25a using a standard hard polishing pad 100. Initially, oxide-polishing slurry 50a is distributed to the polishing pad surface via slurry supply tube 54a for removing the native oxide layer. The oxide-polishing slurry may be supplied to the polishing pad surface before, as, and/or after the substrate "touches down" on the pad.

The oxide-polishing slurry may include deionized water, fumed silica abrasive particles, and a chemically reactive agent, such as potassium hydroxide (KOH), which may also adjust the pH of the slurry. Alternately, KOH may be replaced with an amine-based chemically reactive agent if mobile ions from the KOH contaminate the polysilicon layer. A suitable oxide-polishing slurry is available from Cabot Corp., of Aurora, Ill., under the trade name SS-12.

However, as represented by FIG. 2C, almost immediately after the substrate has been brought into contact with the polishing pad, e.g., after less than about ten seconds of polishing, the CMP apparatus starts distributing polysilicon-polishing slurry 50b to the polishing pad surface via slurry supply tube 54b. In one implementation, the polysilicon-polishing slurry could be distributed after about just three to five seconds of polishing.

The oxide polishing may occur only during the "ramp-up" period at the start of the polishing operation during which the platen is brought up to the desired rotational speed and the carrier head is pressurized to provide the desired load. Since the native oxide layer is very thin, oxide polishing can occur at lower rotational speeds and pressures than polysilicon polishing.

The beginning of the polysilicon-polishing slurry distribution should generally coincide with the ending of of the oxide-polishing slurry distribution. Specifically, distribution of the polysilicon-polishing slurry may start exactly as distribution of the oxide-polishing slurry stops. Alternately, distribution of the polysilicon-polishing slurry may begin just after distribution of the oxide-polishing slurry ends, so that no slurry is distributed to the polishing pad for a brief period, e.g., less than about one second. Alternately, distribution of the polysilicon-polishing slurry may begin just before distribution of the oxide-polishing slurry ends, so that the two slurries are provided to the polishing pad simultaneously for a brief period, e.g., less than about two or three seconds.

The polysilicon-polishing slurry may include deionized water, formed silica abrasive particles, and an amine-based chemically reactive agent which may also adjust the pH of the slurry. Suitable polysilicon-polishing slurries include EPP-1000, EPP-1060, and EPP-100OLRP, available from Cabot Corp.; Planarlite-6101, Planarlite-6102 and Planarlite-6203, available from Fujimi, of Wilsonville, Oregon; and SDE-3000 available from Rodel, Inc. Both the oxide-polishing slurry and the polysilicon-polishing slurry may include other additives to provide selective polishing of their respective materials.

Polysilicon-polishing slurries normally have a selectivity of at least 1:100, i.e. the polishing rate of polysilicon is one-hundred times the polishing rate of a reference material (typically a thermally deposited oxide). The polysilicon-polishing slurries mentioned above from Cabot, Fujimi and Rodel have selectivities of about 1:100 to 1:1000, depending on the composition of the insulative layer. Preferably, polysilicon-polishing slurry 50b has a selectivity of at least 1:50 to substantially prevent polishing of the underlying insulative layer.

As shown by FIGS. 2B and 2C, the brief polishing at polishing station 25a with oxide-polishing slurry 50a is sufficient to remove native oxide layer 18 from the substrate surface.

Referring to FIGS. 2C and 2D, once the native oxide layer has been removed, the substrate is polished with polysilicon-polishing slurry 50b. This polishing continues until polysilicon layer 16 is partially or substantially planarized, i.e., the large scale topography such as the peaks and valleys have been substantially removed.

Referring to FIGS. 2D and 2E, when about half of the polysilicon layer has been removed, the substrate may be transported to polishing station 25b, and the planarization process may be completed using a second standard hard polishing pad 100 and a second polysilicon-polishing slurry 50c. The polysilicon layer is polished at polishing station 25b until the underlying patterned insulative layer 14 is exposed.

The polysilicon-polishing slurry used at polishing station 25b may be substantially the same as the polysilicon-polishing slurry used at polishing station 25a. To prevent contamination of the second polysilicon-polishing slurry, the substrate may be washed at washing station 56a to remove any oxide polishing-slurry before it is transported to polishing station 25b. In any event, since polysilicon-polishing slurry is used exclusively at polishing station 25b, insulative layer 14 should not be polished after it is exposed.

Referring to FIG. 2F, the substrate is transported to polishing station 25c where it is buffed using a standard soft polishing pad 110 and a buffing solution 50d, e.g., deionized water. Buffing solution 50d is supplied to the polishing pad at polishing station 25c by slurry/rinse arm 52c. Referring to FIG. 2G, the resulting substrate 10 has a flat and finished outer surface 19 in which the underlying patterned insulative layer has been completely exposed.

Alternately, referring to FIG. 2H, a thin residual layer 17 having a thickness T may remain over the insulative layer after polishing at polishing station 25b. In this case, as can bee seen from FIG. 2I, the final buffing process at polishing station 25c also removes the residual layer. In addition, buffing solution 50d may include abrasive particles.

The use of the oxide-polishing slurry to remove the native oxide layer at the beginning of the polishing process, followed quickly by the use of the highly selective polysilicon-polishing slurry to polish the polysilicon layer, substantially reduces polishing non-uniformity, dishing and erosion. In addition, it maintains a high polishing rate and avoids polishing of the underlying patterned insulative layer.

Although the planarization of a polysilicon layer has been described, the invention may also be applicable to planarization of other layers, particularly silicon layers, on which a native oxide layer may be formed, such as amorphous silicon (a-Si) and single crystal silicon. The polysilicon-polishing slurry would be replaced by an amorphous silicon-polishing slurry or a single crystal silicon-polishing slurry.

The invention is not limited to the embodiment depicted and described. Rather, the scope of the invention is defined by the appended claims.

What is claimed is:

1. A method of polishing a silicon layer of a substrate, comprising:
    (a) removing a native oxide layer from the silicon layer by chemically mechanically polishing the substrate with an oxide-polishing slurry; and
    (b) thereafter removing at least a substantial portion of the silicon layer by chemically mechanically polishing the silicon layer with a silicon-polishing slurry.

2. The method of claim 1, wherein the silicon layer is polished until an underlying layer is exposed.

3. The method of claim 1, wherein the silicon layer is polished until it is planarized.

4. The method of claim 1, wherein step (a) and at least a portion of step (b) are performed at the same polishing station.

5. The method of claim 1, wherein step (a) comprises distributing the oxide-polishing slurry onto a polishing pad at the polishing station before the substrate is brought into contact with the polishing pad.

6. The method of claim 1, wherein step (a) comprises distributing the oxide-polishing slurry onto a polishing pad at the polishing station as the substrate is brought into contact with the polishing pad.

7. The method of claim 1, wherein step (a) comprises distributing the oxide-polishing slurry onto a polishing pad at the polishing station after the substrate is brought into contact with the polishing pad.

8. The method of claim 1, wherein step (a) comprises distribution of the oxide-polishing slurry onto a polishing pad, and distribution of the oxide-polishing slurry is stopped before distribution of the silicon-polishing slurry starts.

9. The method of claim 1, wherein step (a) comprises distribution of the oxide-polishing slurry onto a polishing pad, and distribution of the oxide-polishing slurry is stopped as distribution of the silicon-polishing slurry starts.

10. The method of claim 1, wherein step (a) comprises distribution of the oxide-polishing slurry onto a polishing pad, and distribution of the oxide-polishing slurry is stopped after distribution of the silicon-polishing slurry starts.

11. The method of claim 1, wherein step (b) is performed at a plurality of polishing stations.

12. The method of claim 1, further comprising buffing the substrate with a buffing solution after step (b).

13. The method of claim 1, wherein the silicon layer is polycrystalline silicon.

14. The method of claim 13, wherein the silicon-polishing slurry is a polycrystalline silicon-polishing slurry.

15. The method of claim 1, wherein the silicon layer is amorphous silicon.

16. The method of claim 15, wherein the silicon-polishing slurry is an amorphous silicon-polishing slurry.

17. The method of claim 1, wherein the silicon layer is single crystalline silicon.

18. The method of claim 17, wherein the silicon-polishing slurry is a single crystalline silicon-polishing slurry.

19. The method of claim 1, wherein the silicon-polishing slurry has a selectivity of at least 1:50.

20. The method of claim 1, wherein step (a) lasts for less than about ten seconds.

21. The method of claim 20, wherein step (a) lasts for about three to five seconds.

22. A method of planarizing a substrate, comprising:
 (a) forming a silicon layer on a non-planar surface of the substrate;
 (b) supplying an oxide-polishing slurry to a surface of a polishing pad;
 (c) bringing the substrate into contact with the polishing pad;

(d) removing a native oxide layer from the silicon layer by chemical mechanical polishing the substrate with the oxide-polishing slurry;
 (e) thereafter supplying a silicon-polishing slurry to the polishing pad; and
 (f) chemical mechanical polishing the substrate with the silicon-polishing slurry until the silicon layer is substantially planarized.

23. The method of claim 22, wherein the silicon layer is polycrystalline silicon and the silicon polishing slurry is a polycrystalline silicon polishing slurry.

24. The method of claim 22, wherein the silicon layer is amorphous silicon and the silicon polishing slurry is an amorphous silicon polishing slurry.

25. The method of claim 22, wherein the silicon layer is single crystalline silicon and the silicon polishing slurry is a single crystalline silicon polishing slurry.

26. The method of claim 22, further comprising polishing the silicon layer at a second polishing pad with a second silicon-polishing slurry until the non-planar surface is exposed.

27. The method of claim 22, further comprising stopping the supply of oxide-polishing slurry surface before the silicon-polishing slurry is supplied to the polishing pad.

28. The method of claim 22, wherein the silicon-polishing slurry is supplied to the polishing pad after the substrate has been in contact with the polishing pad for less than about ten seconds.

29. The method of claim 22, wherein the substrate is chemical mechanically polished with the oxide-polishing slurry for less than about ten seconds.

30. The method of claim 29, wherein the substrate is chemical mechanically polished with the oxide-polishing slurry for about three to five seconds.

31. A method of polishing a silicon layer of a substrate, comprising:
 (a) removing a native oxide layer from the silicon layer by chemically mechanically polishing the substrate with an oxide-polishing slurry; and
 (b) thereafter chemically mechanically polishing the silicon layer with a silicon-polishing slurry until the silicon layer is substantially planarized.

32. A method of polishing a silicon layer disposed over an underlying non-planar surface of a substrate, comprising:
 (a) removing a native oxide layer from the silicon layer by chemically mechanically polishing the substrate with an oxide-polishing slurry; and
 (b) thereafter chemically mechanically polishing the silicon layer with a silicon-polishing slurry until the underlying non-planar surface is exposed.

33. The method of claim 19, wherein the silicon-polishing slurry has a selectivity between about 1:100 and 1:1000.

* * * * *